(12) United States Patent
Barrenscheen et al.

(10) Patent No.: US 6,788,235 B1
(45) Date of Patent: Sep. 7, 2004

(54) A/D CONVERTER HAVING SIGNALING AND REQUESTING CAPABILITY

(75) Inventors: Jens Barrenscheen, Munich (DE); Gunther Fenzl, Hoehenkirchen-Siegertsbrunn (DE); Peter Rohm, Pfaffenhofen (DE); Dietmar Koenig, Munich (DE); Dirk Elkemeier, Clausthal-Zellerfeld (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/581,590
(22) PCT Filed: Oct. 15, 1999
(86) PCT No.: PCT/DE99/03320
§ 371 (c)(1), (2), (4) Date: Jul. 26, 2000
(87) PCT Pub. No.: WO00/22734
PCT Pub. Date: Apr. 20, 2000

(30) Foreign Application Priority Data

Oct. 15, 1998 (DE) .......................................... 198 47 662

(51) Int. Cl.[7] .............................................. H03M 1/12
(52) U.S. Cl. ........................ 341/155; 341/161; 341/144; 341/135; 341/143
(58) Field of Search ................................ 341/161, 155, 341/135, 144, 143, 55, 118

(56) References Cited

U.S. PATENT DOCUMENTS 5,696,511 A * 12/1997 Matsumoto et al. ........ 341/155
5,703,583 A    12/1997 Ansari et al.
5,710,563 A     1/1998 Vu et al.
5,874,912 A *  2/1999 Hasegawa .................... 341/155
6,028,546 A *  2/2000 Signell et al. ............... 341/155
6,204,784 B1 * 3/2001 Hatfield ....................... 341/118
6,304,206 B1 * 10/2001 Wada et al. ................. 341/162
6,377,194 B1 * 4/2002 Sarpeshkar ................. 341/110

FOREIGN PATENT DOCUMENTS

| DE | 197 32 840 | 7/1998 |
|---|---|---|
| EP | 0 474 025 | 3/1992 |
| EP | 0 824 291 | 2/1998 |
| JP | 59-11132 | 11/1984 |

OTHER PUBLICATIONS

Von Der Ahe U: "Busfaehige Analog–/Digitalwandler" Und–Oder–Nor + Steuerungstechnik, DE, Distribution Verlag, GMBH, vol. 26, No. 1, (1993), pp. 24–25.

Hans, "Mittelschneller Umsetzer", *Marktreport*. w/ English Translation.

* cited by examiner

Primary Examiner—Patrick Wamsley
Assistant Examiner—Lam T. Mai
(74) Attorney, Agent, or Firm—Schiff Hardin & Waite

(57) ABSTRACT

The disclosed A/D conversion system is designed to signal the beginning or the impending beginning of an A/D conversion and/or to request the implementation of an A/D conversion from another A/D converter. As a result, it is possible to have a plurality of A/D converters work absolutely time-synchronously with minimal outlay.

16 Claims, 1 Drawing Sheet

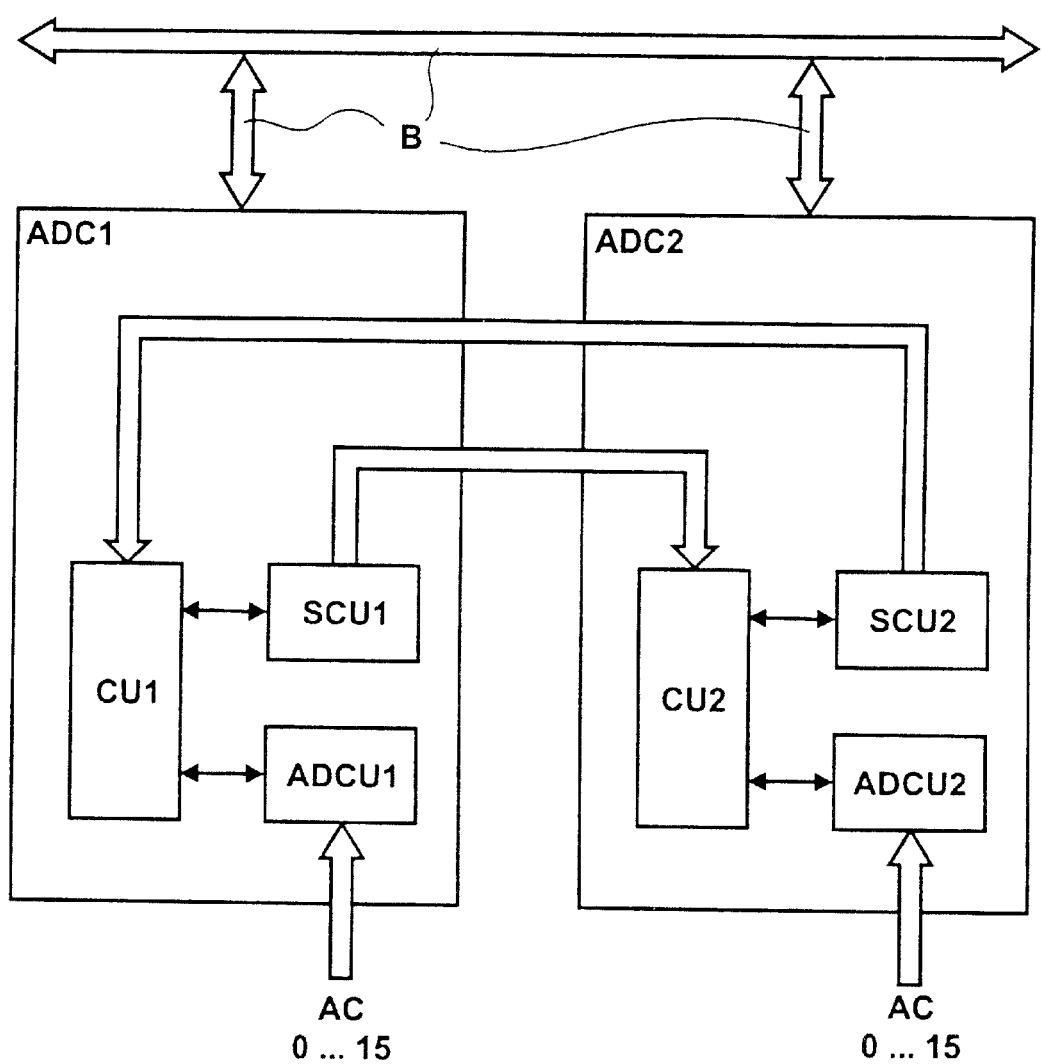

A/D CONVERTER HAVING SIGNALING AND REQUESTING CAPABILITY

BACKGROUND OF THE INVENTION

The present invention is directed to a device for analog-to-digital conversion and, more particularly, a plurality of analog-to-digital converters that are capable of being synchronized with each other.

As the very name already indicates, AND converters (analog-to-digital converters) convert analog signals into digital signals. Innumerable embodiments have been known for many years and require no further explanation.

It is definitely necessary to know voltage levels of a plurality of analog signals acquired exactly simultaneously (absolutely time-synchronized). This is required, for example, to set (regulate) the phase currents of electric motors exactly as desired or in order to implement position acquisitions ensuing according to the resolver principle.

When only one A/D converter is available for the time-synchronous acquisition of a plurality of analog signals, then the time-synchronous acquisition of the plurality of analog signals can be accomplished by providing a plurality of sample and hold elements (S&H elements). The analog signals to be acquired time-synchronously can be simultaneously sampled by the plurality of S&H elements and can be serially A/D-converted by the one A/D converter. Providing, driving and coordinating, the A/D converter and the plurality of S&H elements, however, can involve a considerable cost outlay.

A conceivable alternative to the above alternative is to provide a plurality of A/D converters. As a result thereof, the analog signals to be acquired can not only be time-synchronously sampled but can also be time-synchronously converted. When, in particular, the unit controlling the A/D converters is a program-controlled unit such as, for example, a microprocessor or a micro-controller, it proves extremely difficult, however, to start the plurality of A/D converters exactly simultaneously. In general, a plurality of clock periods of the program-controlled unit lie between the delivery of an A/D conversion request to a first A/D converter and the delivery of an A/D conversion request to a second A/D converter. When the program-controlled unit must react to an interrupt (implement an interrupt service routine) between the delivery of the A/D conversion requests to the various A/D converters, the time difference between the delivery of the A/D conversion requests to the various A/D converters becomes even greater. This, even an approximately simultaneous start of the plurality of A/D converters cannot be assured.

SUMMARY OF THE INVENTION

The present invention is therefore based on an object of finding a solution to dependably start a plurality of A/D converters exactly simultaneously with minimal outlay.

This and other objects are inventively achieved by an A/D converter that is designed to signal the beginning or the impending beginning of an A/D conversion; an A/D converter that is designed to request the implementation of an A/D conversion from another A/D converter.

As a result that it is possible for a plurality of A/D converters to cooperate with one another. In particular, the request for the implementation of an A/D conversion by another A/D converter or signaling the beginning or the impending beginning of an A/D conversion makes it possible for the plurality of A/D converters to independently synchronize with one another (i.e., without the collaboration of a higher-ranking control means) such that they work exactly time-synchronously when required.

Additional advantages and novel features of the invention will be set forth, in part, in the description that follows and, in part, will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

The invention is explained with reference to the FIGURE. The FIGURE shows the structure and the coupling of two A/D converts according to an embodiment of the invention.

DETAILED DESCRIPTION OF THE PREFERRED EMBODIMENTS.

The A/D converter described in greater detail below is one of two essentially identical A/D converters of a micro-controller.

However, it is noted that there is no limitation to use the particular disclosed A/D converter: The micro-controller can fundamentally contain an arbitrary plurality of A/D converters of the type described below, and A/D converters of the type described below can also be utilized outside micro-controllers (i.e., in other devices or as separate A/D converter modules comprising one or more A/D converters).

The part of the micro-controller containing the A/D converters is schematically shown in FIG. 1.

The A/D converters are referenced as ADC1 and ADC2 in FIG. 1.

As was mentioned above, the A/D converters ADC1 and ADC2 are identically constructed. They respectively contain an A/D conversion units ADCU1 and ADCU2, control units CU1 and CU2 controlling the A/D conversion units ADCU1 and ADCU2, respectively and syhronization control units SCU1, and SCU2 that are provided for the synchronization of the corresponding A/D converter with other A/D converters or other devices and cooperate with the control units CU1 and CU2, respectively.

As the referencing of the component parts of the A/D converters ADC1 and ADC2 already implies, the actual A/D conversion occurs in the A/D conversion units ADCU1 and ADCU2. In the example under consideration, one of 16 different analog signals can be converted by each of. The A/D conversion units; the devices carrying the analog signals are referred to as analog channels ACC 0. . . 15.

The A/D converters ADC1 and ADC2 can work completely independent of one another. Also, the same or different analog signals can be supplied to converters ADC1 and ADC2 via the analog channels ACC 0 . . . 15 allocated to them.

Via an internal bus B, the A/D converters ADC1 and ADC2 can be started independently of one another by the CPU of the micro-controller (not shown).

The details of what is involved in an A/D conversion request that triggers starting of the A/D converter is not particularly relevant. That is, independent of the conversion request the information relating to the requested A/D conversion such as the number of the analog channel to be subjected to the A/D conversion, the resolution to be applied in the A/D conversion, and/or control information for one or more multiplexers that precede one or more analog channels can be communicated to the A/D converter to be started with each A/D conversion request.

In response to such an A/D conversion request, the corresponding A/D converter initiates the requested A/D conversion either immediately or later. Under what conditions, when and how the requested A/D conversion is to be implemented is determined by the information communicated together with the A/D conversion request and/or by the content of the channel-specific control registers contained in the A/D converter.

A separate channel-specific control register is present for each analog channel. For example, how long the analog signal received via the corresponding analog channel is to be sampled before the A/D conversion is begun is stored in these channel-specific control registers.

As was already mentioned above, the A/D converters ADC1 and ADC2 can be operated completely independent of one another. Over and above this, however, they are also in the position to mutually synchronize one another. As needed, they can automatically place themselves into a synchronous operating mode in which they implement predetermined A/D conversions absolutely simultaneously or time-synchronously.

Switching into or out of the synchronous operating mode is carried out by the A/D converters themselves. The event triggering the switch into the synchronous operating mode is comprised of an A/D conversion request to one of the A/D converters in response to the A/D conversion request an analog signal of an analog channel is to be converted for which it has been defined that a requested A/D conversion must ensue time-synchronously with another A/D conversion. The particular analog channels where time-synchronous A/D conversions must be performed is defined in the channel-specific control registers that have already been mentioned above. In the example under consideration, the channel-specific control registers contain a bit or a bit that can be pre-set to determining whether the A/D conversion of the analog signal adjacent at the corresponding analog channel is to be executed time-synchronousiy or not with the A/D conversion of another analog signal adjacent at another analog channel (a specific analog channel of the other A/D converter).

Although the invention is not necessarily limited to the present embodiment, it is defined in a preferred embodiment, that the numbers of the analog channels that are to be subjected to a time-synchronous A/D conversion by the plurality of A/D converters are the same. Since the analog channel of different A/D converters may carry different analog signals, identical analog signals are not converted or are, at most, converted only in exceptions.

Given A/D conversion requests received from the CPU of the micro-controller, the A/D converters check by looking in the channel-specific control registers as to whether an analog channel whose analog signal is to be converted time-synchronously with another analog signal is affected by the A/D conversion request.

When this is not the case, an entirely "normal" A/D conversion is performed in the corresponding A/D converter.

When, in contrast, an A/D converter determines that the A/D conversion of the analog signal of the selected analog channel is to be performed time-synchronously with the A/D conversion of an analog signal of another A/D channel, then the corresponding A/D converter switches into the synchronous operating mode and thereby assumes a master status. In conformity with its function, the corresponding A/D converter shall be referred to below as master A/D converter. After switching into the synchronous operating mode, which will be explained later, the other A/D converter assumes a slave status and is, therefore, referred to below as slave A/D converter. It is noted that the A/D converters ADC1 and ADC2 are absolutely equal, (i.e., can be master and slave A/D in alternation).

After entering into the synchronous operating mode, the master A/D converter sends an A/D conversion request to be injected to the other A/D converter, which is still in the normal operating mode at this time. The A/D conversion request is intended to initiate the other A/D converter to implement the A/D conversion to be implemented time-synchronously. Upon receipt of this A/D conversion request, the other A/D converter is likewise placed into the synchronous operating mode, but thereby assumes the aforementioned slave status and thus becomes a slave A/D converter.

In the present embodiment, the A/D conversion request delivered by the master A/D converter contains information and instructions about the A/D conversion to be implemented in the slave A/D converter. In particular, the information may include instructions about the type and nature of the injection of the A/D conversion requested by the master A/D converter into the operation of the slave A/D converter; the number of the analog channel to be subjected to the A/D conversion; the resolution to be employed in the A/D conversion; and control information for one or more multiplexers that precede one or more analog channels of the slave A/D converter.

The instruction about the type and nature of the injection of the A/D conversion requested by the master A/D converter into the operation of the slave A/D converter defines how the slave A/D converter should handle the A/D conversion request to be injected. In the present embodiment, this instruction can be what is referred to as a sync-wait instruction or a sync-repeat instruction.

A sync-wait instruction causes the slave A/D converter to wait with the implementation of the A/D conversion requested by the master A/D converter until an A/D conversion proceeding at the moment has been ended.

A sync-repeat instruction causes the slave A/D converter to begin immediately with the A/D conversion requested by the master A/D converter. Any A/D conversion proceeding at that moment is to be aborted and repeated only after the implementation of the A/D conversion requested by the master A/D converter.

After delivering the A/D conversion request to the slave A/D converter, the master A/D converter waits for a reaction of the slave A/D converter. More particularly, the A/D converter waits for the communication of a signal or a signal sequence with which the master A/D converter is informed that the slave A/D converter has just begun or is just beginning or will immediately begin the implementation of the A/D conversion requested by the master A/D converter.

As soon as the slave A/D converter begins the implementation of the A/D conversion requested by the master A/D converter or immediately before the slave A/D converter begins implementing the A/D conversion requested by the master A/D converter, the slave A/D converter signals this ensuing or impending event to the master A/D converter.

The slave A/D converter preferably signals the impending beginning of the A/D conversion requested by the master A/D converter, whereby the actual beginning of the A/D conversion ensues at a point in time that occurs at a defined time after the signaling of the impending beginning of the A/D conversion, and wherein preferably, the defined time is exactly as long as the time that the master A/D converter requires in order to react to the signaling of the impending beginning of the A/D conversion it has requested and to, in turn, begin with the A/D conversion requested by the CPU of the microcontroller. The implementation of the A/D conversions to be implemented time-synchronously is then begun exactly time-synchronously (clock-synchronously).

The CPU of the micro-controller is only minimally burdened by the initiation and implementation of the A/D conversions to be implemented time-synchronously. The CPU must merely deliver an A/D conversion request to one of the A/D converters ADC1 of ADC2 to be operated time-synchronously. The A/D converters ADC1 and ADC2 handle the rest by themselves by synchronizing themselves on the basis of a simple handshake procedure without the collaboration of the CPU of the micro-controller, so that, as a result, they begin the implementation of the A/D conversions to be implemented time-synchronously exactly simultaneously or with minimal time offset. The CPU of the micro-controller need not inform the second A/D converter regarding which analog channel this is to subject to an A/D conversion and upon which parameters employment is to occur. This communication, is carried out by the A/D converter that the CPU has requested to implement one of the A/D conversions to be implemented time-synchronously.

After the implementation of the A/D conversions to be implemented time-synchronously, the A/D converters automatically leave the synchronous operating mode and automatically again become independently operable and functioning A/D converters as they were before entering into the synchronous operating mode.

In order to assure a malfunction-free operation of the A/D converters ADC1 and ADC2 under all circumstances, a few exceptional cases must be considered.

One of these exceptional cases is when the master A/D converter receives a further A/D conversion request from the CPU of the micro-controller following the request for an A/D conversion by the slave A/D converter but before receiving the message about the successful or impending beginning of the implementation of the requested conversion. In this case, the master A/D converter must first check which of the A/D conversions has the higher priority. When it is the earlier A/D conversion request being processed at the moment that has the higher priority, then the implementation of the more recent A/D conversion request is postponed until the earlier A/D conversion request being processed at the moment has been implemented. When, on the contrary, it is the more recent A/D conversion request that has the higher priority, then the processing of the earlier A/D conversion request must be aborted and automatically implemented again after the implementation of the more recent A/D conversion request. Included in the abort of the processing of the earlier A/D conversion request is that the master A/D converter returns the slave A/D converter into the "normal" operating mode from the synchronous operating mode initiated by the A/D conversion request on the part of the master A/D converter by communicating corresponding data and/or signals. The master A/D converter itself leaves the synchronous operating mode.

Another exceptional case is when the slave A/D converter receives a higher-priority A/D conversion request from the CPU of the micro-controller before the beginning of or during the processing of an A/D conversion requested by the master A/D converter. This could lead to longer interruptions or delays in the implementation of the A/D conversion requested by the master A/D converter. In the example under consideration here, this exceptional case is countered in that the A/D conversion requested by the master A/D converter has the highest priority assigned to it. Excessive interruptions or delays in the implementation of the A/D conversion requested by the master A/D converter and the complications connected therewith are thus avoided.

Another exceptional case is when both A/D converters have switched into the master status and now request the implementation of an A/D conversion from the respective other A/D converter essentially at the same time. In a preferred embodiment; this exceptional case is remedied in that the A/D converters can independently leave the master status at any time in conflict situations. The conditions under which an A/D converter leaves or is forced to leave the master status in unscheduled fashion can basically be arbitrary. In the preferred embodiment, converters is to leave the A/D converters that leave the master status in case of conflict is dependent on the time sequence of the mutual A/D conversion requests (whichever requests earlier, is given priority) and in the event no decision can be made based on the time sequence, the decision is based on the numbers of the analog channels that are to be subjected to the respective A/D conversions (whichever subjects or wishes to subject the analog channel with the higher number to an A/D conversion is given priority).

The disclosed A/D converters can be modified in various ways.

For example, it is possible that the master A/D converter orders the aforementioned sync-repeat mode and begins implementing the A/D conversion at a predetermined time after delivering the A/D conversion request, (i.e., without waiting for the reaction of the slave A/D converter). A plurality of A/D conversions can also be time-synchronously implemented as a result thereof. As a result of the sync-repeat mode, of course, the slave A/D converter is instructed to implement the requested A/D conversion immediately (potentially aborting an A/D conversion ongoing at the moment), which allows the beginning of the A/D conversion by the slave A/D converter to also be known without signaling the beginning or the impending beginning of the A/D conversion.

Conversely, of course, the communication and the handshake between the A/D converters can also be designed more extensive as desired.

A/D converters of the above-described type can cooperate (be operated running synchronously on their own) not only with one another but also with other arbitrary devices (for example other periphery units of the micro-controller).

Independently of the details of their practical realization, the A/D converters constructed and operated as disclosed above or similar to that disclosed above afford operations undertaken time-synchronously to be implemented with exact time synchronism given a minimal burden on higher-ranking control devices.

In an embodiment of the invention, different input signals must often be A/D-converted given increasingly more complex applications, the situation can arise where two or more analog channels must be sampled absolutely synchronously with different sampling rates. Particularly in applications in telecommunications or when acquiring audio signals, it is often necessary that, for example, two or more analog channels must be sampled with different sampling rates in order to prepare them for further processing. This problem was previously solved by employing two or more sample-and-hold elements (S&H) or a plurality of external, independent A/D converter modules. However, this solution is very involved in circuit-oriented terms and requires additional computer power of the central computer unit (CPU) of the program-controlled unit that controls the conversion.

The problem of colliding requests of different sources is solved in the following way by the present invention. The employment of a plurality of structurally identical A/D converter modules combined with timer units (not shown)

allows a synchronous conversion of a plurality of channels with a plurality of different frequencies to be requested and implemented. This request and conversion advantageously requires no additional computing power of the central computer unit. The problem of colliding request signals of the individual request sources is solved with the assistance of a deterministic prioritization method, for example via channel numbers.

While this invention has been described in connection with what are presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. An analog-to-digital conversion system comprising:
   a plurality of analog-to-digital converters each comprising:
      an analog-to-digital conversion unit for receiving a plurality of analog signals and converting the analog signals to digital signals,
      a control unit for controlling the analog-to-digital conversion unit, and
      a synchronization control unit configured for synchronizing the analog-to-digital converter with at least one other analog-to-digital converter of the plurality of analog-to-digital converters;
   wherein
   at least one of the plurality of analog-to-digital converters comprises communication circuitry to communicate information between the at least one analog-to-digital converter and at least one other analog-to-digital converter of the plurality of analog-to-digital converters;
   wherein the at least one of the plurality of analog-to-digital converters is configured to signal one of a beginning and an impending beginning of an analog-to-digital conversion to the at least one other analog-to-digital converter.

2. The analog-to-digital conversion system according to claim 1, wherein an analog-to-digital converter of the plurality of analog-to-digital converters is configured to one of receive from or transmit to another one of the plurality of analog-to-digital converters a request to implement an analog-to-digital conversion.

3. The analog-to-digital conversion system according to claim 2, wherein the analog-to-digital converter is configured to check whether the analog-to-digital conversion is to be implemented time-synchronously with at least one further analog-to-digital conversion prior to implementing the analog-to-digital conversion when the analog-to-digital converter receives the request to implement the analog-to-digital conversion.

4. The analog-to-digital conversion system according to claim 3, wherein predetermined analog-to-digital conversions that are to be time-synchronously with the at least one further analog-to-digital conversion are stored within the analog-to-digital converter.

5. The analog-to-digital conversion system according to claim 2, wherein the analog-to-digital converter implements a received request for analog-to-digital conversion from another analog-to-digital converter of the plurality of analog-to-digital converters before the analog-to-digital converter implements transmitted request for analog-to-digital conversion that the analog-to-digital converter has transmitted.

6. The analog-to-digital conversion system according to claim 5, wherein the analog-to-digital converter waits to implement the analog-to-digital conversion until the another analog-to-digital converter signals a beginning or an impending beginning of the analog-to-digital conversion requested by the analog-to-digital converter.

7. The analog-to-digital conversion system according to claim 2, wherein the analog-to-digital converter contains predetermined information concerning how requested analog-to-digital conversions transmitted to and received from the another one of the plurality of analog-to-digital converters are to be processed.

8. The analog-to-digital conversion system according to claim 7, wherein the analog-to-digital converter is configured to instruct the another one of the plurality of analog-to-digital converters to immediately begin a requested analog-to-digital conversion.

9. The analog-to-digital conversion system according to claim 7, wherein the analog-to-digital converter is configured to instruct the another one of the plurality of analog-to-digital converters to abort a presently running analog-to-digital conversion and to repeat the presently running analog-to-digital conversion after the implementation of another requested analog-to-digital conversion.

10. The analog-to-digital conversion system according to claim 7, wherein the analog-to-digital converter instructs the another one of the plurality of analog-to-digital converters to postpone implementation of the requested analog-to-digital conversion until a presently running analog-to-digital conversion has ended.

11. The analog-to-digital conversion system according to claim 2, wherein analog-to-digital conversion requests transmitted by the analog-to-digital converter to the another one of the plurality of analog-to-digital converters are assigned highest priority.

12. The analog-to-digital conversion system according to claim 1, wherein each of the plurality of analog-to-digital converters is respectively configured to accept conversion requests issued by another one of the plurality of analog-to-digital converters.

13. The analog-to-digital conversion system according to claim 1, wherein all of the plurality of analog-to-digital converters are structurally identical and further comprising at least one timing unit that effects synchronous conversion of a plurality of channels with a plurality of different frequencies of the structurally identical plurality of analog-to-digital converters.

14. An analog-to-digital converter, comprising:
    a circuit that converts an analog signal into a digital signal, and;
    a conversion request output connected to a conversion request input of an other analog-to-digital converter, the output configured to carry an output signal to the input of the other analog-to-digital converter in order to request an A/D conversion from the other analog-to-digital converter.

15. A method for operating an A/D converter, comprising:
    signaling a beginning or an impending beginning of an A/D conversion by an A/D converter; and
    converting an analog signal to a digital signal by the A/D converter.

16. A method for operating an A/D converter, comprising:
    converting an analog signal to a digital signal; and
    requesting, by the A/D converter, an A/D conversion from an other A/D converter.

* * * * *